(12) United States Patent
Ni et al.

(10) Patent No.: US 8,111,499 B2
(45) Date of Patent: Feb. 7, 2012

(54) SYSTEM AND METHOD OF SENSING AND REMOVING RESIDUAL CHARGE FROM A PROCESSED WAFER

(75) Inventors: Tuqiang Ni, Shanghai (CN); Jinyuan Chen, Shanghai (CN); Ye Wang, Shanghai (CN); Ruoxin Du, Shanghai (CN); Liang Ouyang, Shanghai (CN)

(73) Assignee: Advanced Micro-Fabrication Equipment, Inc. Asia, Georgetown, Grand Cayman (KY)

( * ) Notice: Subject to any disclaimer, the term of this patent is extended or adjusted under 35 U.S.C. 154(b) by 245 days.

(21) Appl. No.: 12/505,381

(22) Filed: Jul. 17, 2009

(65) Prior Publication Data

US 2010/0271744 A1 Oct. 28, 2010

(30) Foreign Application Priority Data

Apr. 24, 2009 (CN) .......................... 2009 1 0049960

(51) Int. Cl.
*H01L 21/683* (2006.01)
*H01T 23/00* (2006.01)

(52) U.S. Cl. ...................................... 361/234
(58) Field of Classification Search .................. 361/234
See application file for complete search history.

(56) References Cited

U.S. PATENT DOCUMENTS

| 5,880,924 A * | 3/1999 | Kumar et al. ................. 361/234 |
| 5,900,062 A | 5/1999 | Loewenhardt et al. |
| 6,236,555 B1 * | 5/2001 | Leeser ........................... 361/234 |
| 6,307,728 B1 * | 10/2001 | Leeser ........................... 361/234 |
| 6,608,746 B2 * | 8/2003 | Ku ................................. 361/234 |
| 6,646,857 B2 * | 11/2003 | Anderson et al. ............. 361/234 |
| 6,790,375 B1 | 9/2004 | Howald et al. |
| 6,965,506 B2 | 11/2005 | Howald |
| 7,160,392 B2 | 1/2007 | Shang et al. |
| 7,204,888 B2 | 4/2007 | Tran et al. |
| 2008/0218931 A1 | 9/2008 | Hsu et al. |
| 2010/0208409 A1 * | 8/2010 | Bluck et al. ................... 361/234 |
| 2010/0218895 A1 * | 9/2010 | Tezuka ..................... 156/345.28 |

OTHER PUBLICATIONS

Kin P. Cheung, et al., "Plasma-assisted wafer de-chucking (power-lift) process induced charging damage," Proceedings, International Symposium on Plasma Process Induced Damage (P2ID), p25, 2001.

* cited by examiner

*Primary Examiner* — Dharti Patel
(74) *Attorney, Agent, or Firm* — Nixon Peabody LLP; Joseph Bach, Esq.

(57) ABSTRACT

Systems and methods for removing residual charge from a processed wafer are described. Removal of residual charge eliminates de-chucking failure that may break or damage the wafer. Residual charge is removed by applying a reverse polarity discharging DC voltage to an electrode embedded in an electrostatic chuck (ESC) supporting the wafer, and providing an outlet to the residual charge to ground via a lift pin assembly. Lift pin assembly is kept at the same potential with respect to a pedestal of the ESC to avoid sparking during the application of RF power to generate plasma. A residual charge sensor is included to sense and measure the amount of residual charge, so that the parameters of the reverse polarity discharging voltage can be adjusted in a subsequent de-chucking operation.

23 Claims, 9 Drawing Sheets

| Test | Voltage Variation | Lift Pin Configuration | Result |
|---|---|---|---|
| 1 | Condition 1 of FIG. 7 (reverse voltage to compensate sticking force during de-chucking) | Lift pin shorted with ground during moving up and lifting the wafer | Wafer didn't break or shift |
| 2 | Condition 2 of FIG. 7 (no reverse voltage to compensate sticking force during de-chucking) | Lift pin shorted with ground during moving up and lifting the wafer | Wafer didn't break or shift |
| 3 | Condition 3 of FIG. 7 (clamping voltage on throughout de-chucking) | Lift pin shorted with ground during moving up and lifting the wafer | Wafer didn't break, but it's position drifted by about 2 mm |
| 4 | Condition 2 of FIG. 7 (no reverse voltage to compensate sticking force during de-chucking) | Lift pin not shorted with ground during moving up and lifting the wafer | Wafer broke |

FIG. 8

SYSTEM AND METHOD OF SENSING AND REMOVING RESIDUAL CHARGE FROM A PROCESSED WAFER

RELATED APPLICATIONS

This application claims priority from Chinese Patent Application Serial No. 200910049960.6, which was filed on Apr. 24, 2009, the entire disclosure of which is incorporated herein by reference.

BACKGROUND

1. Field of the Invention

This invention relates to the art of substrate micro-fabrication and, more particularly, to processed substrate discharge and transfer from an electrostatic chuck.

2. Related Arts

Micro-fabrication of substrates is a well know art employed in, for example, fabrication of semiconductors, flat panel displays, light emitting diodes (LED's), solar cells, etc. Various steps in micro-fabrication may include plasma-assisted processes, (such as, plasma enhanced chemical vapor deposition, reactive ion etching, etc.) performed inside a reaction chamber, into which a process gas is introduced. A radio frequency (RF) source is inductively and/or capacitively coupled to the reaction chamber to energize the process gas to form and maintain a plasma. Inside the reaction chamber, an exposed substrate is supported by a chuck, and held at a fixed position on the chuck by some kind of clamping force.

One conventional type of chuck is an electrostatic chuck (ESC), which uses electrostatic forces to hold or clamp a substrate during processing. A DC electrode, coupled to a high-voltage DC source induces opposite polarity electrostatic charges between the ESC and the wafer to generate the electrostatic clamping force.

After processing is done, the substrate needs to be removed or "de-chucked" from the chuck. To de-chuck, the high-voltage DC source is turned off. However, as residual charges tend to remain on the entire backside of the substrate or at portions of the backside of the substrate, often the substrate fails to separate from the wafer, and/or breaks into pieces or is otherwise damaged during lifting.

In prior arts, various techniques have been attempted to facilitate de-chucking by supplying a reverse polarity discharging voltage to the DC electrode, and/or providing an outlet for the residual charge. In one of the existing methods, a peak current flowing through the chuck during lifting the substrate at the end of a plasma process is measured to control the amplitude and/or duration of the reverse polarity discharging voltage in the next run. In another existing methods, a capacitance detector is used for measuring the capacitance between the ESC electrode and the substrate, and calculates a reverse polarity discharging voltage based on the capacitance measured by the capacitance detector. Thus, magnitude of the reverse polarity discharging voltage fluctuates with various factors, such as RF power applied during wafer processing, surface status of the ESC, etc.

Lift pins are used in some conventional ESC chucks to raise the substrate from the surface of the ESC chuck, so that a robotic arm can reach beneath the substrate, and transport the processed substrate away. In one existing method, a lift pin is made conductive and is grounded to provide a discharging path to the residual charge. The lift pin may incorporates a RF filter and/or a resistor along the discharging path. In another existing method, a lift pin is grounded via a switch and a variable resistor. For reference, readers are directed to U.S. Pat. No. 6,790,375 to Howald et al., US publication 2008/0218931 to Hsu et al., U.S. Pat. No. 5,900,062 to Loewenhardt et al., and U.S. Pat. No. 6,646,857 to Anderson et al.

What is needed is de-chucking systems and methods of de-chucking that reduce de-chucking failure by discharging residual charges from a processed substrate, and optimize the subsequent de-chucking process by using gathered data from a prior de-chucking run.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to certain aspects of the invention, a system for de-chucking a wafer comprising a residual charge sensor, a controller, and a RF blocking inductor is described. A reaction chamber houses an electrostatic chuck (ESC) configured to hold a wafer by electrostatic forces. A radio frequency (RF) source is coupled to the reaction chamber to generate and sustain a plasma that processes the wafer. At least one conductive lift pin is configured to be moved upwards from a retracted position through an opening in the electrostatic chuck to make contact with a bottom surface of the wafer. A lift pin driving mechanism controls the movement of the lift pin. A first switch, when closed, establishes a first discharging path for the wafer when the lift pin makes contact with the wafer after wafer processing. A residual charge sensor disposed along the first discharging path senses a residual charge discharging from the wafer via the first discharge path. A first inductor blocks radio frequency currents from reaching the residual charge sensor during wafer processing, wherein the first inductor is placed between the first switch and the lift pin. A controller receiving an output signal from the residual charge sensor determines the amount of the residual charge.

According to other aspects of the invention, a conductive pedestal supporting the ESC is electrically connected to a conductive lift pin to keep them at the same electrical potential. A RF source is coupled to the conductive pedestal. At least one conductive lift pin is configured to be moved upwards from a retracted position through an opening in the ESC to touch the bottom surface of the wafer. A discharge path for the residual charge in the wafer is established either to ground or by shorting the DC electrode of the ESC with the conductive lift pin.

Aspects of the present invention also include a method of de-chucking a wafer, comprising: chucking a wafer on an electrostatic chuck in a reaction chamber applying a clamping voltage; processing the wafer using a plasma formed and sustained by a RF source coupled to the reaction chamber; blocking RF currents from reaching a first switch along a first discharge path to ground by placing a RF blocking inductor between the first switch and the reaction chamber; terminating the clamping voltage; discharging a residual charge from the wafer via the first discharge path by raising at least one conductive lift pin to touch a bottom surface of the wafer; sensing the residual charge on the wafer; and determining the amount of the residual charge to generate a control signal correlated to the amount of residual charge.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Embodiments of the present invention enables improved de-chucking process employing a lift pin, and reduce the probability of wafer damage during de-chucking.

Figure 1A:
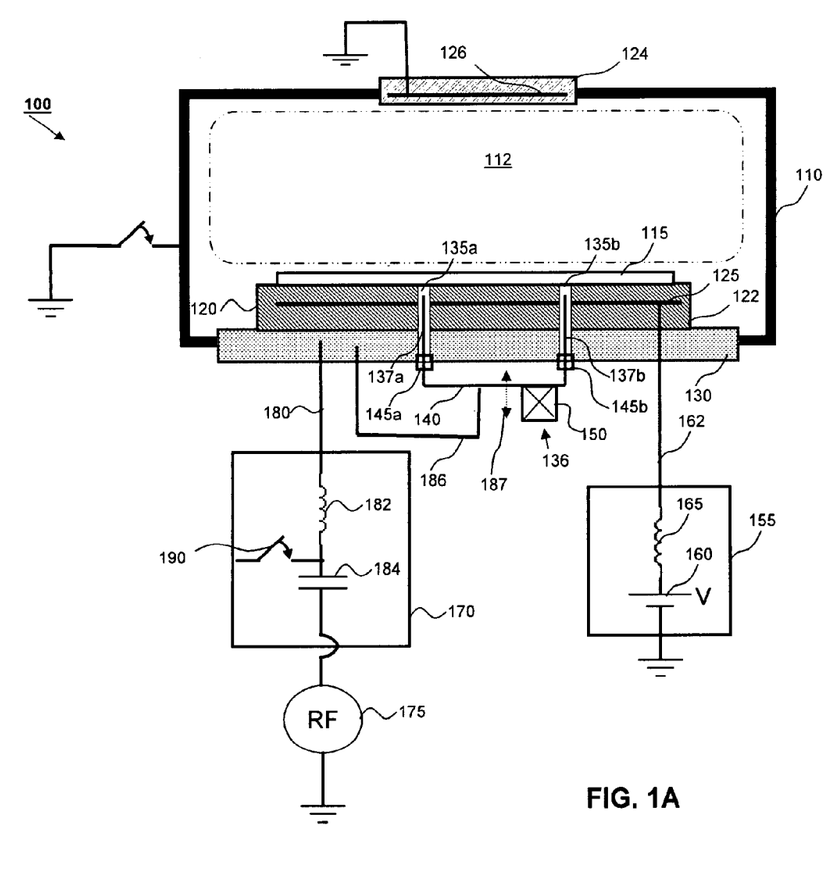
FIG. 1A-1B illustrate two configurations of a system for discharging a wafer on an electrostatic chuck, according to an embodiment of the present invention.

FIG. 1A shows a processing chamber 100 where the improved de-chucking, according to an embodiment of the present invention can be utilized. Processing chamber 100 includes a reaction chamber 110, within which a plasma 112 is formed by applying radio-frequency (RF) power to process a wafer 115. Reaction chamber 110 may be grounded. It is to be noted that the terms "wafer" and "substrate" have been used interchangeably in the subsequent description to mean a work-piece which is being processed in reaction chamber 110. Wafer 115 may comprise a semiconductor wafer or a dielectric wafer. Various fluids, such as a process gas for forming plasma 112, a cooling gas/liquid etc. are introduced in the reaction chamber 110 as required by the micro-fabrication process, and pre-process and post-process conditioning of reaction chamber 110. For clarity, various fluid inlets and outlets to and from reaction chamber 110 and vacuum pumps to evacuate reaction chamber 110 are not shown in FIG. 1.

Wafer 115 is mounted on an electrostatic chuck (ESC) 120. ESC 120 may be a Coulomb-type or Johnsen-Rahbek (JR)-type chuck, or any other type of standard or custom chucks. ESC 120 has a dielectric body portion 122 that supports wafer 115. A DC electrode 125 is embedded in the dielectric body portion 122. A high-voltage (HV) module 155 is coupled to DC electrode 125 through an electrical connector 162 to supply DC voltage to ESC 120 to generate electrostatic clamping force that hold the wafer during processing. HV module 155 includes a high-voltage source 160 which is grounded at one end. HV source 160 may be a bi-polar voltage source that can provide a range of positive or negative DC voltage with respect to the grounded terminal. As discussed above, and will be elaborated further, reverse polarity DC voltage may be needed to be applied to DC electrode 125 to discharge ESC 120 after a plasma process. Additionally, HV module 155 may include a RF filter, e.g., a RF-blocking inductor 165, as shown in FIG. 1. RF-blocking inductor 165 prevents RF currents to reach HV source 160.

ESC 120 is supported by an ESC pedestal 130, which is usually made of a conductive material, e.g., aluminum. ESC pedestal 130 acts as a cathode terminal for capacitive coupling of RF power to reaction chamber 110 to generate and sustain plasma 112. An anode terminal 126 may be disposed at the top of reaction chamber, insulated from the body of the reaction chamber 110 by dielectric 124. It is to be noted that in addition to capacitive coupling, RF power may be inductively coupled too using an inductive coil (not shown in the embodiment depicted in FIG. 1A).

ESC 120 and ESC pedestal 130 have matched through-holes 135, through which lift pins 137 are moved upwards to make contact with a bottom surface of wafer 115. In FIG. 1, a lift pin assembly 136 with two lift pins 137a and 137b are shown aligned with corresponding through-holes 135a and 135b. A system may have any number of lift pins and corresponding through-holes. Typically, lift pins 137 are parked at a retracted position, when wafer 115 is clamped to ESC 120 during processing. After processing ends, lift pins 137 are moved upwards gradually. A lift pin assembly 136 may have a connecting member 140 connecting individual lift pins 137. Number of lift pins and their spacing are designed such that wafer 115 can be supported adequately and flatly when raised above the top surface of ESC 120. A lift-pin assembly 136 includes some type of a driving mechanism to control the vertical motion (indicated by the up-down arrow 187) of the lift pin assembly 136. For example, the driving mechanism may include a motor 150. Bellows 145a-b couple lift pins 137a-b to ESC pedestal 130 in a vacuum-tight way. To facilitate residual discharge of wafer 115, lift pins 137 and lift pin connecting member 140 are made electrically conductive. However, lift pins 137 are electrically isolated from DC electrode 125.

RF power is supplied by a RF source 175 via a RF matching device 170 connected to ESC pedestal 130 by an electrical connector 180. RF matching device 170 may include an inductor 182 and a capacitor 184. An electrical connector 186 connects the lift pins 137a-b to ESC pedestal 130. In the example shown in FIG. 1A, electrical connector 186 connects the conductive lift-pin connecting member 140 to ESC pedestal 130. Electrical connector 186 ensures that ESC pedestal 130 and lift pins 137 are at the same electric potential so that no high-voltage sparks are formed across through-holes 135.

RF matching device 170 may include a switch 190. Switch 190 is configured to establish a discharge path for the wafer to ground (when RF power is off, and lift pins 137 touch the bottom surface of wafer 115). Switch 190 may be a relay that can be opened or closed to disconnect or establish the discharging path to ground. Switch 190 may be a vacuum relay or any other type of relay. Though switch 190 has been shown to be included in RF matching device 170 in FIG. 1, switch 190 may be located outside of and independent of RF matching device 170.

It is to be noted that when RF source 175 is on, and switch 190 is open, there is still a possibility of RF currents jumping through and damaging switch 190 before finding a return discharge path to ground. Positioning inductor 182 between ESC pedestal 130 and switch 190, and choosing the right value and frequency response for inductor 182 may prevent the possibility of damaging switch 190 by blocking RF currents. Persons skilled in the art will appreciate that while a single inductor 182 is shown in FIG. 1A for illustrative purpose, separate inductors may be used for RF source impedance matching and blocking return RF currents.

Figure 1B:
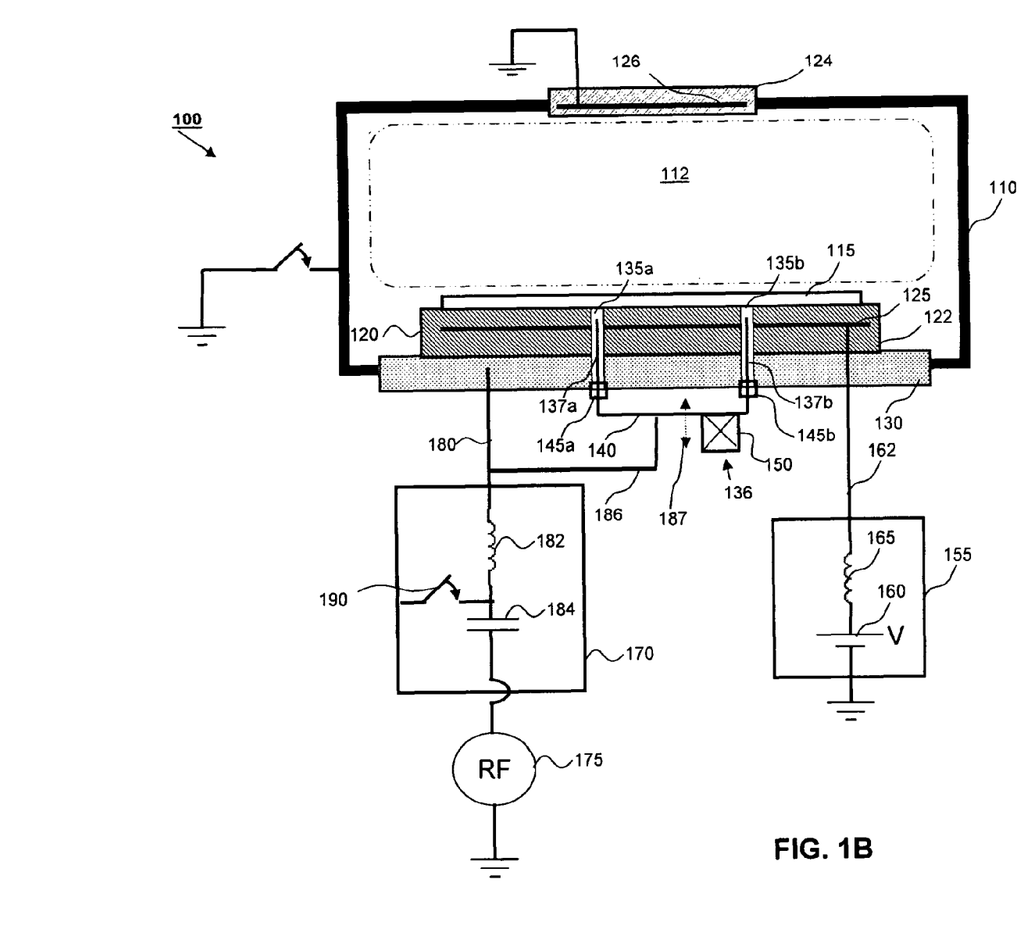

FIG. 1B illustrates another system embodiment 110, which is identical to processing chamber 100 of FIG. 1A, but depicts an alternative way of connecting ESC pedestal 130 with lift pins 137a-b. In system 110, electrical connector 186 branches out from electrical connector 180. Persons skilled in the art will appreciate that various electrical connection is possible to bring ESC 130 and lift pins 137a-b at the same electrical potential, the invention is not limited by any particular electrical connection.

Figure 2:
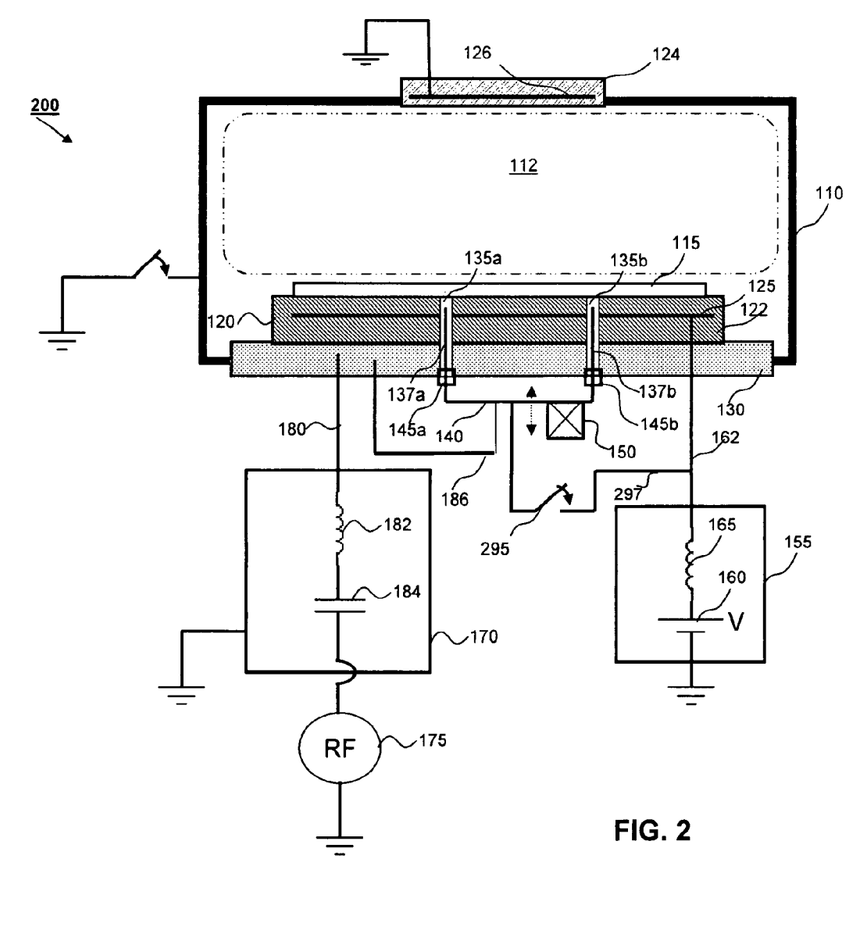
FIG. 2 illustrates a system for discharging a wafer on an electrostatic chuck via an alternative path, according to another embodiment of the present invention.

FIG. 2 illustrates another system embodiment 200 of the present invention. System 200 has many elements that are identical to processing chamber 100, as indicated by identical reference numbers. The main difference between processing chamber 100 and system 200 is that switch 190 is not present in system 200. Instead of switch 190, system 200 includes a switch 295 that is configured to establish an alternative discharging path for wafer 115.

Switch 295, when closed, couples lift pins 137a-b to DC electrode 125 via electrical connector 297. After wafer processing, when RF source 175 is turned off, and switch 295 is closed, as the lift pins touch the bottom surface of wafer 115, DC electrode 125 and wafer 115 attain the same electric potential. In other words, DC electrode 125 and wafer 115 are shorted, and wafer 115 is discharged. Switch 295 may be a vacuum relay or any other type of relay.

Figure 3:
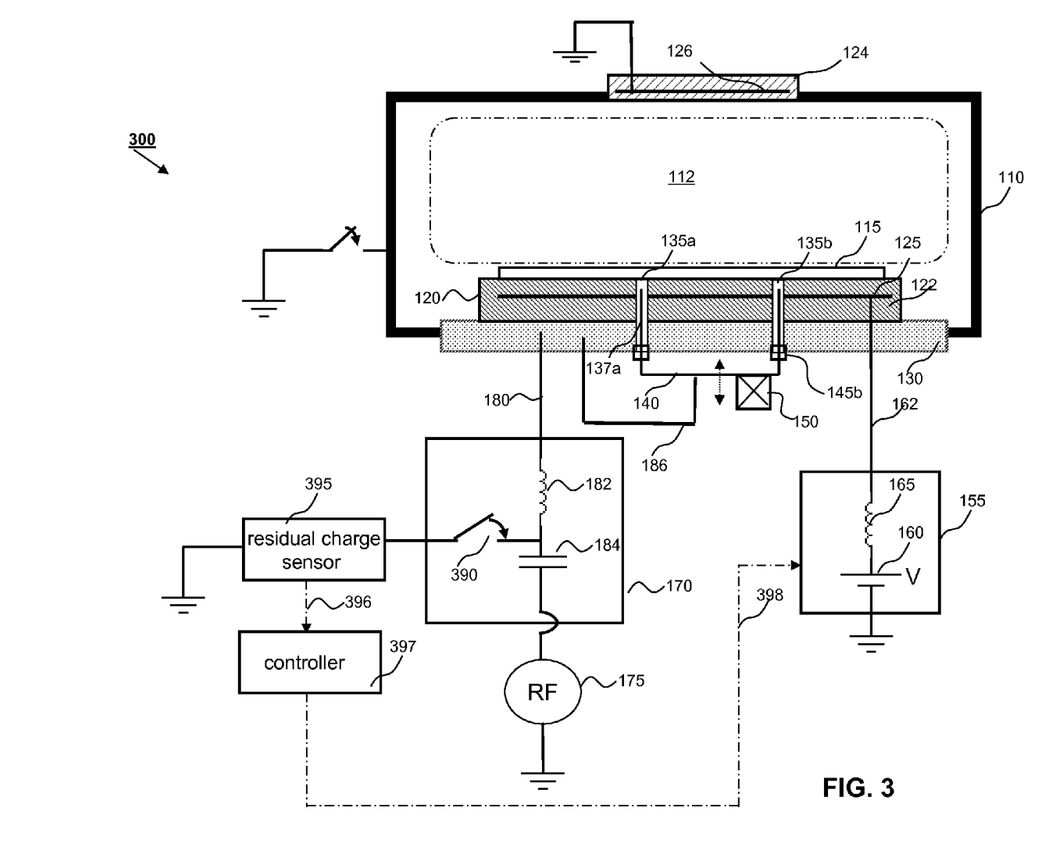
FIG. 3 illustrates a system for sensing and removing the residual charge on a wafer on an electrostatic chuck using a feed-forward control, according to another embodiment of the present invention.

As persons skilled in the art will appreciate, if the goal of the de-chucking process is to simply get rid of the residual charge from wafer 115, and it is not necessary to measure the amount of residual charge on wafer 115 for the purpose of optimizing the de-chucking process for the next wafer, then processing chamber 100, 110 and 200 provide different enabling solutions. On the other hand, FIG. 3 illustrates another embodiment 300 of the present invention, where the amount of residual charge on wafer 115 is monitored. The measured residual charge value can be used to perform feedforward control of de-chucking process for the subsequent wafers. For example, the magnitude and timing of reverse polarity discharging voltage can be adjusted based on the measured residual charge from a previous run.

System 300 has many elements that are identical to processing chamber 100, as indicated by identical reference numbers. Additional components in system 300 include a residual charge sensor 395, and a controller 397. Dash-dot lines 396 and 398 indicate propagation path of signals between various elements of system 300. For example, residual charge sensor 395 determines the amount of residual charge from a current wafer, and communicates that to controller 397 via path 396. Controller 397 may include a feedforward micro-controller. Controller 397 calculates the required magnitude of reverse polarity discharging voltage, and sends an appropriate control signal via path 398 to HV module 155 to adjust the discharging voltage magnitude and timing for de-chucking the next wafer. Although residual charge sensor 395 and controller 397 are shown as separate functional blocks in the example embodiment shown in FIG. 3, persons skilled in the art will appreciate that controller 397 may include all of some elements of residual charge sensor 395 as a subsystem. For example, a voltage integrator 410 (shown in FIG. 4A) or a high-impedance voltage monitor 512 (shown in FIG. 5A) may be included in controller 397, although they are shown as part of the residual charge sensor 395. Additionally, controller 397 may be a central controller, e.g. a dedicated computer, that controls various system and operational parameters, such as process gas pressure, ESC temperature, RF power parameters etc.

Switch 390 may be similar to switch 190 shown in processing chamber 100 of FIG. 1. However, instead of being grounded directly as in switch 190, a terminal of switch 390 goes into one end of the residual charge sensor 395, which is grounded at the other end. Details of residual charge sensor 395 are discussed with respect to FIGS. 4A-4C and 5A-5B. It is noted that although not shown in FIG. 3, an alternative second discharge path including switch 295 (similar to system 200) may be included in system 300 as well, if the system is being used in a discharge-only mode, where no residual charge monitoring is required. In that case, switch 390 may be kept open so that the residual charge has a preferred discharge path via closed switch 295, and residual charge sensor 395 is bypassed.

Figure 4A:
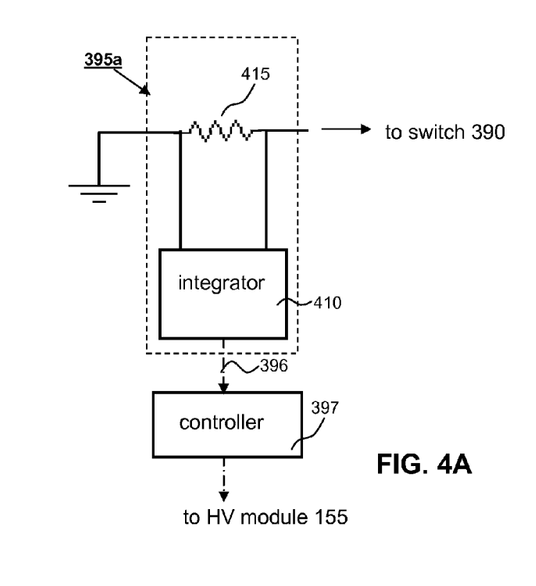
FIGS. 4A-4B illustrate two possible configurations of a residual charge sensor, according to embodiments of the present invention.
Figure 4B:
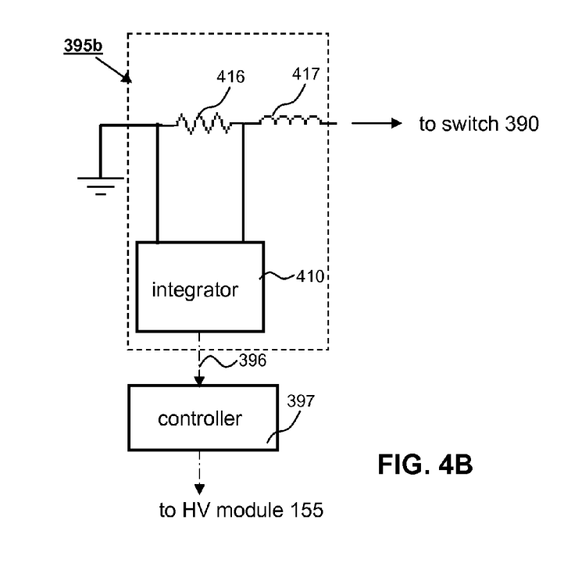
Figure 4C:
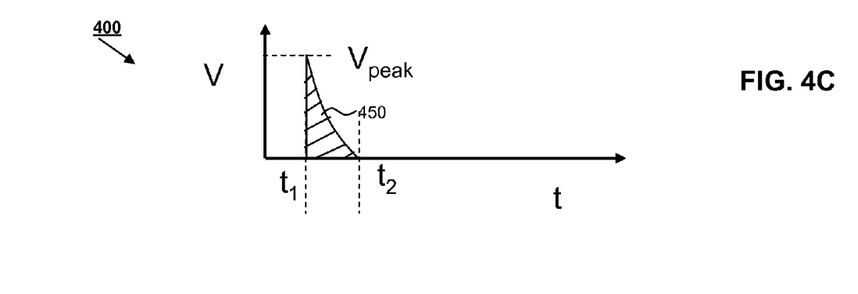
FIG. 4C illustrates a the time-voltage plot of a voltage integrator included in the residual charge sensor of FIGS. 4A-4B.

FIG. 4A illustrates one configuration 395a of the residual charge sensor 395 shown in FIG. 3. Configuration 395a includes a resistor 415, which may be a current limiting discharging resistor, through which residual charge is discharged to ground, and a voltage integrator 410 across resistor 415. FIG. 4B illustrates another configuration 395b of the residual charge sensor 395 that includes an inductor 417 in series with resistor 416. Inductor 417 smoothes out a possible current surge through resistor 416. Voltage integrator 410 positioned across resistor 415 senses and measures the amount of residual charge while wafer 115 is being lifted by lift pins 137 (with RF off, and switch 390 closed). As the lift pin pushes wafer 115 up, the distance between a central portion of the backside of the wafer 115 and the top surface of ESC 120 increases, while the edges of the wafer may still be sticking to ESC 120. A spike in voltage is observed by voltage integrator 410, as shown in FIG. 4C. The voltage reaches a peak value $V_{peak}$ at a time $t=t_1$. Then wafer 115 gets detached from ESC 120, and the residual charge gets drained to the ground through the discharge path containing lift pin 137, connecting member 140, electrical connectors 186 and 180, inductor 182, closed switch 390, inductor 417, if it is present, and resistor 415. At $t=t_2$, the accumulated residual charge dies down completely. Usually, it takes only milliseconds for total residual charge discharge to ground. The shaded area 450 under the voltage response curve 400 of voltage integrator 410 represents the amount of total residual charge.

Figure 5A:
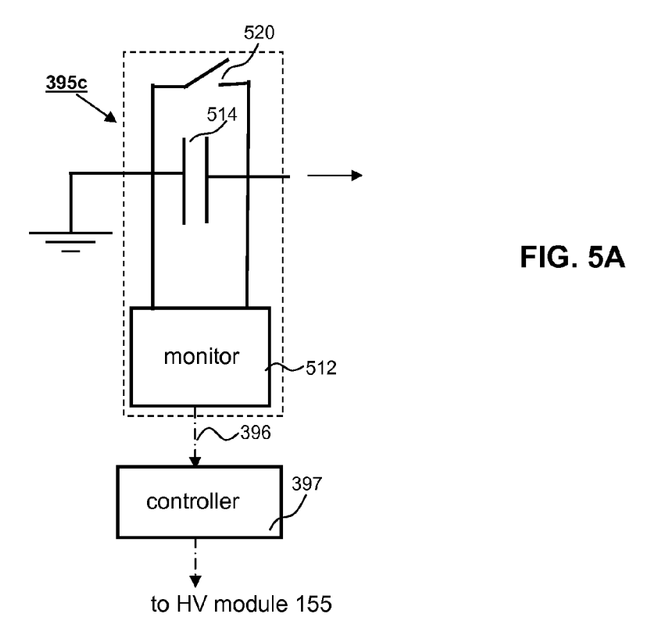
FIG. 5A illustrates another possible configuration of a residual charge sensor including a capacitor, according to an embodiment of the present invention.
Figure 5B:
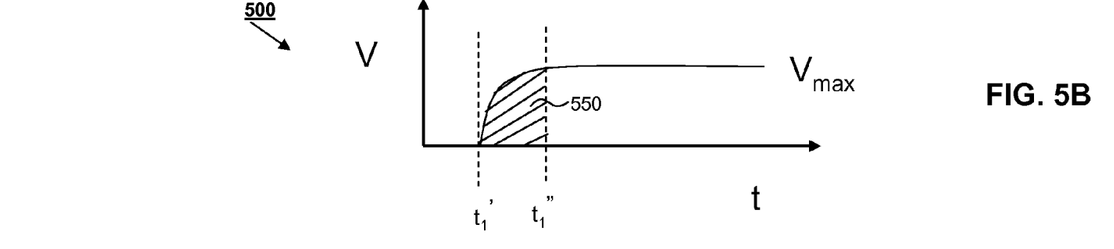
FIG. 5B illustrates a the time-voltage plot of a high impedance voltage monitor included in the residual charge sensor of FIG. 5A.

FIG. 5A illustrates another configuration 395c of the residual charge sensor 395 shown in FIG. 3. Configuration 395c includes a capacitor 514, a switch 520 across capacitor 514, and a high-impedance voltage monitor 512, also across capacitor 514. Instead of letting the residual charge discharge to ground, in configuration 395c, residual charge from wafer 115 is transferred to capacitor 514 via lift pin 137, connecting member 140, electrical connector 186 and 180, inductor 182, and closed switch 390. Switch 520 is open when capacitor 514 is charging up. Voltage monitor 512 measures a voltage V across capacitor 514. As shown in the voltage response curve 500 of voltage monitor 512, capacitor 514 starts charging up at $t=t_1$ and at a time $t=t_2$, reaches a maximum voltage $V_{max}$, and stays there until switch 520 is closed to discharge capacitor 514. The shaded area 550 shown in FIG. 5B represents the amount of total residual charge transferred from wafer 115 to capacitor 514. Typically, capacitor 514 has a value in the range of microfarads. Once the required data is collected and/or stored from residual charge sensor 395c, switch 520 is closed to discharge capacitor 514. Switch 520 is shown to illustrate just one possible discharge path for the capacitor. Alternative discharge paths may be included in embodiments of system 300.

In summary, system 300 enables measuring the amount of residual charge removed from the wafer in an initial run. In the next run, de-chucking voltage parameters may be adjusted based on the residual charge measurements.

Figure 6:
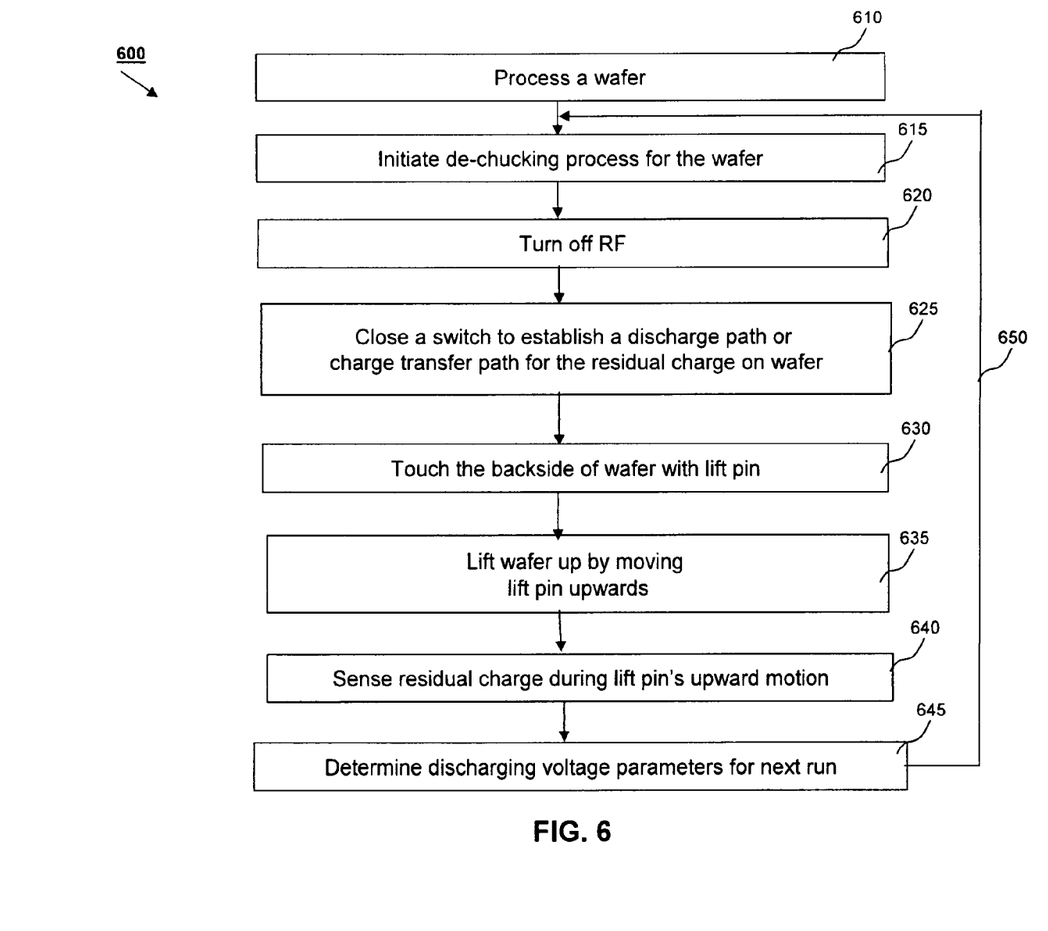
FIG. 6 illustrates a flowchart showing a process of de-chucking, according to an embodiment of the present invention.

FIG. 6 schematically illustrates a flowchart of a method 600 for improved de-chucking, according to an embodiment of the present invention. In an example, method 600 can be implemented by one or more of the systems discussed above.

Method 600 starts at step 610, where a wafer is processed using plasma-assisted micro-fabrication steps within a reaction chamber with the RF power on.

In step 615, a de-chucking procedure is executed, which may include applying a reverse polarity discharging DC voltage to DC electrode in the ESC to neutralize accumulated charge on the wafer. The parameters of the reverse polarity discharging DC voltage may be determined by trial and error, by using stored historical data, by using data from a similar but externally characterized ESC, or by other empirical means in the initial run.

In step 620, the RF power is turned off. Note that, steps 615 and 620 are interchangeable in sequence. In some systems, RF power is on to keep the plasma on during the application of the reverse polarity discharging DC voltage. In other systems, RF power and plasma are off during the application of the reverse polarity discharging DC voltage. However, it is imperative that the RF power is turned off before going to the next step 625.

In step 625, a switch is closed in preparation of establishing a discharge path (e.g. a path to transfer the charge to ground or to a capacitive sensor) for the residual charge on the wafer. For example, in system 300, switch 390 is closed. Lift pins are still at their initial retracted position.

In step 630, lift pins are raised from their initial retracted position to touch the backside of the wafer. Now, the discharge path is established.

In step 635, lift pins are raised further to push the wafer upwards, and eventually lift the wafer off of the top surface of the ESC.

In step 640, residual charge is sensed and measured using a residual charge sensor. Persons skilled in the art will understand that steps 635 and 640 may take place simultaneously.

In step 645, amount of residual charge and discharge time (in case of a capacitive sensor, charge transfer time) are calculated. These calculated values are utilized to determine what should be the magnitude and timing of the reverse polarity discharging voltage in the subsequent de-chucking operation for the next processed wafer. A feed-forward control loop 650 is used to adjust reverse polarity DC discharging voltage parameters in the next run.

The above steps are described for illustrative purposes only. Embodiments of the invention are not limited to the example steps, and may skip one or more steps, or follow additional intermediate or terminal steps, not shown here.

Figure 7:
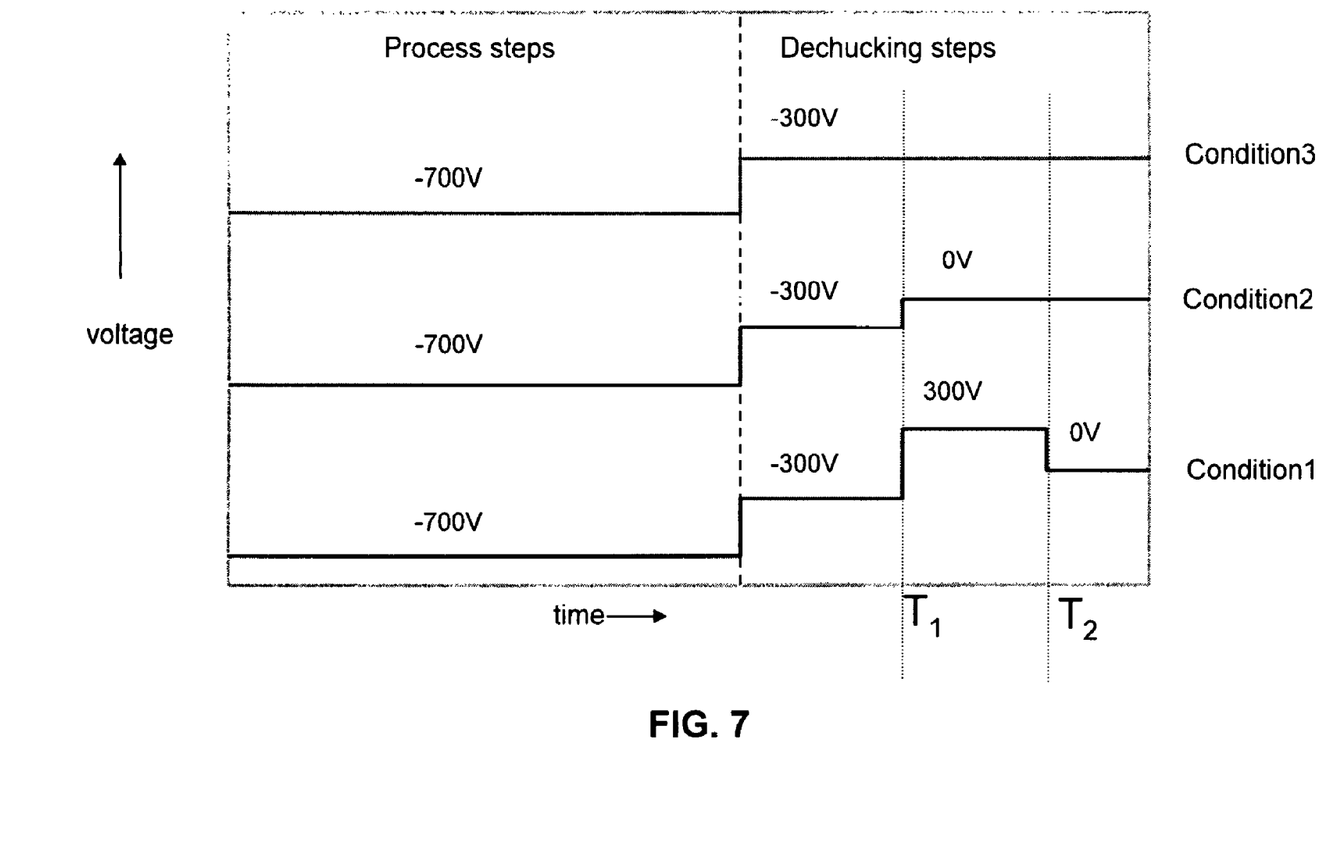
FIG. 7 illustrates three different voltage conditions used for testing the de-chucking process, according to embodiments of the present invention.

FIG. 7 shows three example voltage conditions used for testing the efficacy of the de-chucking process according to the present invention. In all three cases, a bare silicon wafer was used as the test substrate or test wafer. A $C_4F_8$/Oxygen/Argon plasma was formed using two RF power sources: one operating at 60 MHz and 2100 W, and the other working at 2 MHz and 1400 W. The reaction chamber was at a pressure of 30 Torr. Persons skilled in the art will understand that the above test conditions are provided as examples, and the embodiments of the invention is not limited by the above test conditions.

As shown in FIG. 7, in all three test conditions, the clamping voltage applied to DC electrode 125 during the plasma process was set to −700V. At the beginning of de-chucking process, the applied clamping voltage was reset to a modified value of −300V, and was maintained until a time $t=T_1$. In condition 1, a reverse polarity voltage of 300V is applied for a certain period of time ($T_2-T_1$) to compensate for the sticking force (due to residual charges in the wafer) before turning of the clamping voltage off altogether. In condition 2, no reverse polarity discharging voltage was applied, and the clamping voltage was terminated at $t=T_1$. In condition 3, the modified clamping voltage of −300V was kept on throughout the de-chucking process. It is noted that magnitude variation of voltage in the de-chucking steps and $T_1$ and $T_2$ may be adjusted based on discharging data available from a previous run.

Figure 8:
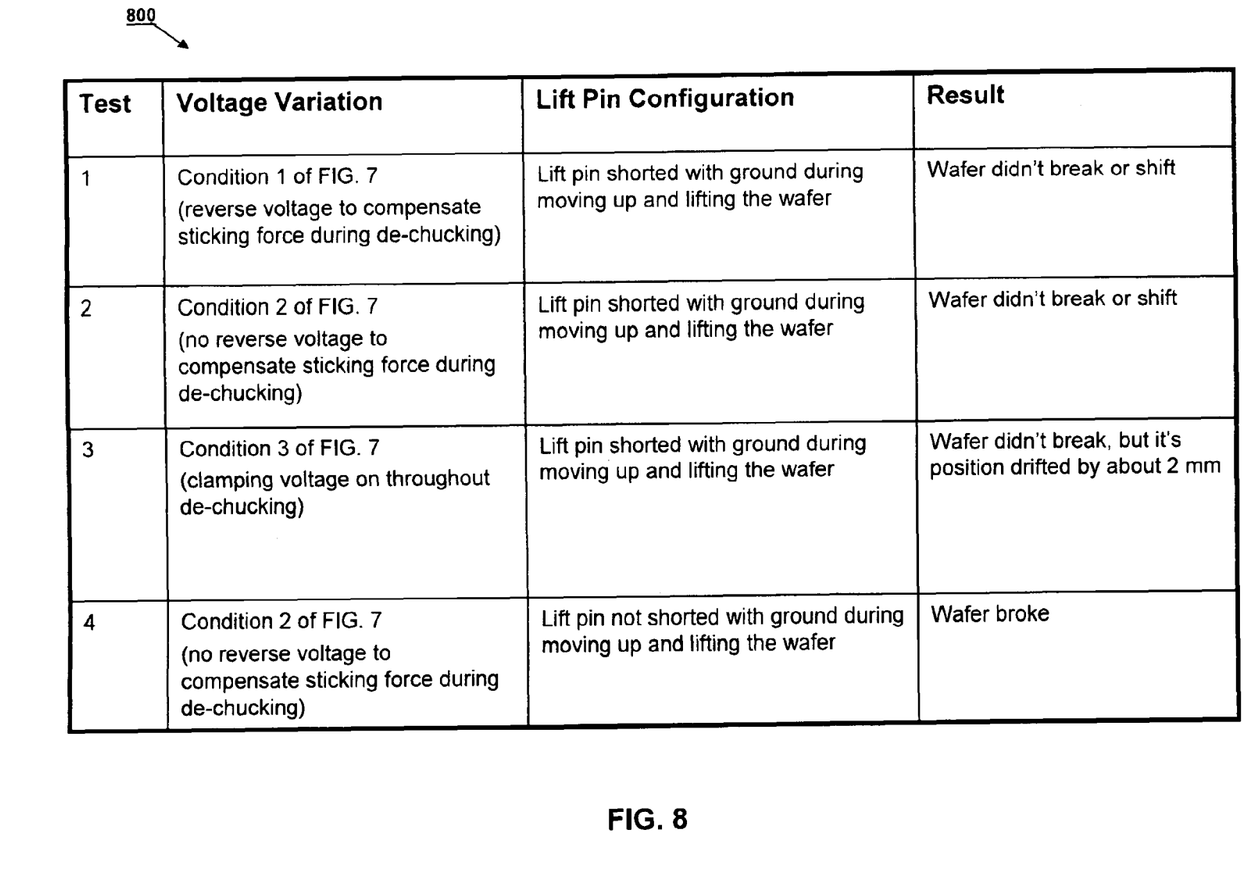
FIG. 8 illustrates a table showing different test conditions for de-chucking, and the corresponding results.

Four tests were conducted using the above three voltage patterns and corresponding lift pin position configurations. Table 800 in FIG. 8 describes the results from the four tests. As evident from the table 800, the best results were obtained from tests 1 and 2, where the lift pin was shorted to ground while lifting the wafer, and either zero or a reverse polarity discharging voltage was applied. In both test 1 and test 2, wafer did not break or shift. The wafer completely broke in test 4, where the clamping voltage was terminated and the lift pin was not shorted to ground while lifting the wafer. In test 3, the wafer did not break, but drifted significantly (by ~2 mm) with the modified clamping voltage on and the lift pin shorted when lifting the wafer.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the server arts. It is intended that the specification and examples be considered as exemplary only, with a true scope and spirit of the invention being indicated by the following claims.

The invention claimed is:

1. A system for de-chucking a wafer supported on an electrostatic chuck (ESC) within a reaction chamber, wherein a radio frequency (RF) source generates and sustains a plasma to process the wafer in the reaction chamber, and at least one conductive lift pin is made to contact the wafer after processing for discharging the wafer, the system comprising:
    a residual charge sensor disposed along a first discharging path to sense a residual charge discharging from the wafer via the first discharge path;
    a first inductor coupled between the residual charge sensor and the lift pin; and a controller receiving an output signal from the residual charge sensor and determining the amount of the residual charge.

2. The system of claim 1, wherein the controller further comprises:
a feed-forward control system that generates a control signal based on the amount of residual charge to adjust discharging DC voltage parameters for at least one subsequent de-chucking operation applied to a next wafer.

3. The system of claim 1, wherein the system further comprises:
a conductive pedestal supporting the electrostatic chuck, wherein the RF source is coupled to the reaction chamber through the conductive pedestal.

4. The system of claim 3, wherein the lift pin is electrically coupled to the conductive pedestal to be at the same potential with the conductive pedestal.

5. The system of claim 1, wherein the residual charge sensor comprises a resistor and a voltage integrator across the resistor.

6. The system of claim 5, wherein the residual charge sensor further comprises a second inductor in series with the resistor.

7. The system of claim 1, wherein the residual charge sensor comprises a capacitor and a voltage monitor across the capacitor.

8. The system of claim 7, wherein the residual charge sensor further comprises a discharging path for the capacitor.

9. The system of claim 1, wherein a first switch is disposed between the residual charge sensor and the first inductor to establish the first discharging path when the first switch is closed.

10. A method, comprising:
chucking a wafer on an electrostatic chuck in a reaction chamber by applying a clamping voltage;
processing the wafer using a plasma formed and sustained by a RF source coupled to the reaction chamber;
blocking RF currents from reaching a first switch along a first discharge path to ground by placing a RF blocking inductor between the first switch and the reaction chamber;
terminating the clamping voltage;
discharging a residual charge from the wafer via the first discharge path by raising at least one conductive lift pin to touch a bottom surface of the wafer;
sensing the residual charge on the wafer; and
determining the amount of the residual charge to generate a control signal correlated to the amount of residual charge.

11. The method of claim 10, wherein the residual charge determination step comprises:
calculating the amount of residual charge on the wafer by estimating a total area under a voltage-time plot across a discharging resistor during the upward motion of the lift pin.

12. The method of claim 10, wherein the residual charge determination step comprises:
calculating the total residual charge on the wafer by estimating an area under a voltage-time plot representing a transfer of charge to a capacitor disposed along the first discharging path during the upward motion of the lift pin.

13. The method of claim 10, further comprising:
using the control signal to adjust a discharging DC voltage parameters for at least one subsequent de-chucking operation applied to a next wafer.

14. The method of claim 10, the discharging residual charge step further comprises:
closing a first switch disposed between the lift pin and a residual charge sensor before touching the bottom surface of the wafer.

15. A system for de-chucking a wafer, comprising:
an electrostatic chuck (ESC) configured to hold a wafer by electrostatic forces;
a conductive pedestal supporting the ESC;
a radio frequency (RF) source coupled to the conductive pedestal to generate and sustain a plasma that processes the wafer;
at least one conductive lift pin configured to be moved upwards from a retracted position through an opening in the electrostatic chuck to make contact with a bottom surface of the wafer;
a first switch that, when closed, establishes a first discharging path for the wafer when the lift pin makes contact with the wafer;
a residual charge sensor disposed along the first discharging path to sense a residual charge discharging from the wafer via the first discharge path;
and
an electrical connector connecting the conductive lift pin to the conductive pedestal.

16. The system of claim 15, wherein the system further comprises:
a first inductor that blocks radio frequency currents from reaching the residual charge sensor during wafer processing, wherein the first inductor is placed between the first switch and the lift pin.

17. The system of claim 15, wherein the system further comprises:
a controller receiving an output signal from the residual charge sensor and determining the amount of the residual charge.

18. The system of claim 17, wherein the controller further comprises:
a feed-forward control system that generates a control signal based on the amount of residual charge to adjust discharging DC voltage parameters for at least one subsequent de-chucking operation applied to a next wafer.

19. The system of claim 15, wherein the residual charge sensor comprises a resistor and a voltage integrator across the resistor.

20. The system of claim 19, wherein the residual charge sensor further comprises an inductor in series with the resistor.

21. The system of claim 15, wherein the residual charge sensor comprises a capacitor and a high impedance voltage monitor across the capacitor.

22. The system of claim 21, wherein the residual charge sensor further comprises a discharging path for the capacitor.

23. The system of claim 15, wherein the first switch is placed between the lift pin and a high-voltage DC source module, wherein closing the first switch shorts the DC electrode with the wafer when the lift pin makes contact with the wafer.

* * * * *